(12) United States Patent
Smith

(10) Patent No.: US 7,982,884 B2
(45) Date of Patent: Jul. 19, 2011

(54) AUTOFOCUS SYSTEM WITH ERROR COMPENSATION

(75) Inventor: Daniel Gene Smith, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 120 days.

(21) Appl. No.: 12/275,110

(22) Filed: Nov. 20, 2008

(65) Prior Publication Data

US 2009/0135437 A1    May 28, 2009

Related U.S. Application Data

(60) Provisional application No. 61/004,527, filed on Nov. 28, 2007.

(51) Int. Cl.
*G01B 11/24* (2006.01)
(52) U.S. Cl. .................. 356/622; 356/614
(58) Field of Classification Search ........... 356/614–622
See application file for complete search history.

(56) References Cited

U.S. PATENT DOCUMENTS

| | | | |
|---|---|---|---|
| 5,602,399 A | 2/1997 | Mizutani | |
| 5,661,548 A | 8/1997 | Imai | |
| 6,034,780 A * | 3/2000 | Kato | .............. 356/400 |
| 6,333,776 B1 | 12/2001 | Taniguchi | |
| 6,414,743 B1 | 7/2002 | Nishi et al. | |
| 6,977,728 B2 | 12/2005 | Nakauchi | |

FOREIGN PATENT DOCUMENTS

JP    2007-192685 A    8/2007

OTHER PUBLICATIONS

International Search Report and Written Opinion for PCT/US2008/084238 (related to the present application), publication date Feb. 3, 2009, Nikon Corporation.
International Preliminary Report on Patentability for PCT/US2008/084238 (related to the present application), publication date Jun. 10, 2010, Nikon Corporation.

* cited by examiner

*Primary Examiner* — Michael P Stafira
(74) *Attorney, Agent, or Firm* — Roeder & Broder LLP

(57) ABSTRACT

An autofocus system (222C) for measuring the position of a work piece (200) along an axis includes a slit light source assembly (236), a slit detector assembly (238), and a control system (224). The slit light source assembly (236) directs a first slit of light (342A) at a first slit area (344A) of the work piece (200). The slit detector assembly (238) detects light reflected off of the first slit area (344A) and generates a first slit signal relating to the amount of light reflected off of the first slit area (344A) at the slit detector assembly (238). The control system (224) uses the first slit signal from the slit detector assembly (238), and first reflectance information of the first slit area (344A) to determine the position of the work piece (200) along the axis. With this design, the autofocus system (222C) can compensate for the changes in reflectivity of the work piece (200). As a result thereof, measurements taken with the autofocus system (222C) are more accurate and the work piece (200) can be positioned with improved accuracy.

15 Claims, 6 Drawing Sheets

AUTOFOCUS SYSTEM WITH ERROR COMPENSATION

RELATED APPLICATION

The application claims priority on Provisional Application Ser. No. 61/004,527 filed on Nov. 28, 2007, entitled "AUTOFOCUS ERROR COMPENSATION SCHEME". As far as is permitted, the contents of Provisional Application Ser. No. 61/004,527 are incorporated herein by reference.

BACKGROUND

Exposure apparatuses for semiconductor processing are commonly used to transfer images from a reticle onto a semiconductor wafer during semiconductor processing. A typical exposure apparatus includes an illumination source, a reticle stage assembly that positions a reticle, an optical assembly having an optical axis, a wafer stage assembly that positions a semiconductor wafer, a measurement system, and a control system. One type of stage assembly includes a stage base, a stage that retains the wafer or reticle, and a stage mover assembly that moves the stage and the wafer or the reticle. The measurement system constantly monitors the position of each stage and the control system controls each stage mover assembly to constantly adjust the position of the reticle and the wafer. The features of the images transferred onto the wafer from the reticle are extremely small. Accordingly, the precise positioning of the wafer and the reticle is critical to the manufacturing of high quality wafers.

In certain designs, the measurement system includes an autofocus assembly that monitors the position of the wafer along the optical axis. Subsequently, with information regarding the position along the optical axis, the stage mover assembly can be controlled to properly position the wafer along the optical axis.

One type of autofocus assembly includes a slit light source that illuminates a set of slits and an imaging system that projects the set of slits onto the wafer. The light reflected from the wafer is then directed into a receiving imaging system that projects an image of the slits onto a second set of slits. The light that passes through the second set of slits is subsequently measured by a slit detector assembly. With information from the slit detector assembly, the position of the wafer along the optical axis can be determined.

The autofocus assembly discussed above utilizes the plurality of slits of light reflected off of the wafer to determine the position of the wafer along the optical axis. Unfortunately, the reflectivity of the wafer varies along the surface of the wafer. For example, circuits and other features on or below the wafer surface can influence the reflectivity of the wafer at that area. The variable reflectance of the wafer can adversely influence the light reflected off of the wafer. As a result thereof, the position of the wafer perpendicular to the optical axis influences the measurements performed by the autofocus assembly and the accuracy of the measurements obtained by the autofocus assembly.

SUMMARY

The present invention is directed to an autofocus system for measuring the position of a work piece along an axis. In one embodiment, the autofocus system includes a slit light source assembly, a slit detector assembly, and a control system. The slit light source assembly directs a first slit of light at a first slit area of the work piece. The slit detector assembly detects light reflected off of the first slit area and generates a first slit signal relating to the amount of light reflected off of the first slit area at the slit detector assembly. The control system uses the first slit signal from the slit detector assembly, and first reflectance information of at least a portion of the first slit area to determine the position of the work piece along the axis. With this design, the autofocus system can compensate for the changes in reflectivity of the work piece. As a result thereof, measurements taken with the autofocus system are more accurate and the work piece can be positioned with improved accuracy. Further, the autofocus system can be used with an exposure apparatus to manufacture higher density wafers.

In certain embodiments, the autofocus system includes a reflectance measuring system that generates the first reflectance information relating to the reflectance at least a portion of the first slit area. For example, the reflectance measuring system can include an area type detector, such as a charge coupled device.

Basically, the present invention provides a means of correcting for the reflectance variations of the work piece. The basic principle is that a duplicate image of the reflected slits of light are directed to the reflectance measuring system that is capable of measuring the relative reflectance in the sub-regions of the slit image. Once the relative reflectance is calculated, it can be used to reconstruct a detector signal that is relatively insensitive to patterns on the work piece. Stated in another fashion, the control system can use the reflectance information as a compensation factor for the slit signals from the slit detector assembly.

In another embodiment, (i) the slit light source assembly directs a second slit of light at a second slit area of the work piece, (ii) the slit detector assembly detects light reflected off the second slit area and generates a second slit signal relating to the amount of light reflected off of the second slit area at the slit detector assembly, and (iii) the control system uses slit data from the slit detector assembly, first reflectance information from the first slit area, and second reflectance information from the second slit area to determine the position of the work piece along the axis.

Additionally, the present invention is directed to a stage assembly that moves the work piece. In this embodiment, the stage assembly including a stage that retains the work piece and the autofocus system described herein that measures the position of the work piece along an axis. Further, the present invention is directed to an exposure apparatus that includes an illumination system and the stage assembly that moves the stage relative to the illumination system.

Moreover, the present invention is directed to a process for manufacturing a device. The present invention is also directed to a method for measuring the position of a work piece along an axis that includes the steps of: (i) directing a first slit of light at the first slit area of the work piece with a slit light source assembly; (ii) detecting light reflected off of the first slit area with a slit detector assembly that generates a first slit signal relating to the amount of light reflected off of the first slit area at the slit detector assembly; and (iii) determining the position of the work piece along the axis with a control system that uses the first slit signal from the slit detector assembly and first reflectance information of the first slit area.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
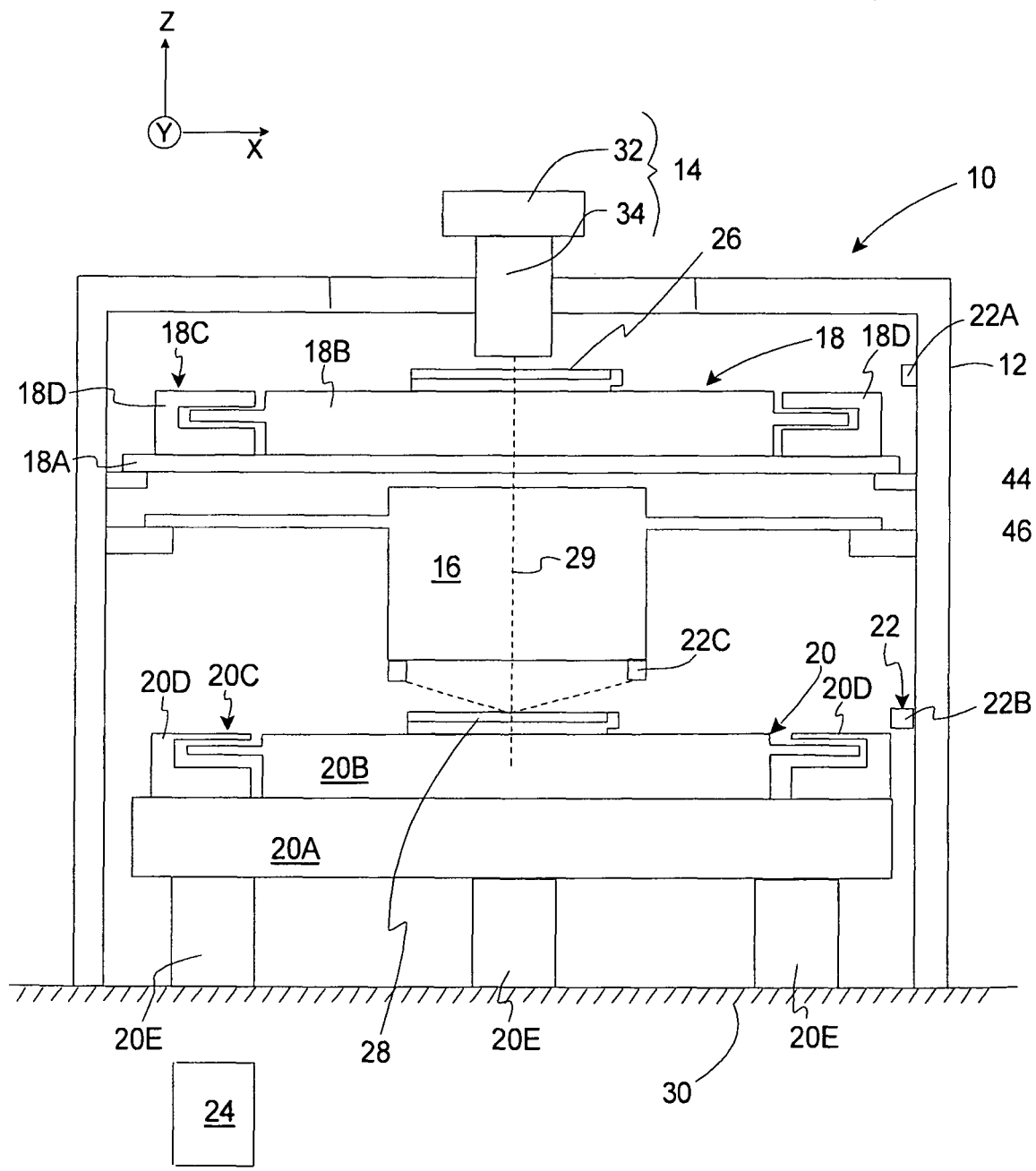
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As an overview, in certain embodiments, the measurement system 22 is uniquely designed to monitor the position of one or both of the stage assemblies 18, 20 with improved accuracy. More specifically, the measurement system 22 includes an autofocus system 22C that measures the position along a Z axis with improved accuracy. As a result thereof, one or both the stage assemblies 18, 20 can be positioned with improved accuracy, and the exposure apparatus 10 can be used to manufacture higher density wafers.

A number of Figures include an orientation system that illustrates an X axis, a Y axis that is orthogonal to the X axis, and the Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis 29 (along the Z axis in FIG. 1) of the optical assembly 16 by the reticle stage assembly 18 and the wafer 28 is moved perpendicularly to the optical axis 29 by the wafer stage assembly 20. Scanning of the reticle 26 and the wafer 28 occurs while the reticle 26 and the wafer 28 are moving synchronously.

Alternatively, the exposure apparatus 10 can be a step-and-repeat type photolithography system that exposes the reticle 26 while the reticle 26 and the wafer 28 are stationary. In the step and repeat process, the wafer 28 is in a constant position relative to the reticle 26 and the optical assembly 16 during the exposure of an individual field. Subsequently, between consecutive exposure steps, the wafer 28 is consecutively moved with the wafer stage assembly 20 perpendicularly to the optical axis of the optical assembly 16 so that the next field of the wafer 28 is brought into position relative to the optical assembly 16 and the reticle 26 for exposure. Following this process, the images on the reticle 26 are sequentially exposed onto the fields of the wafer 28, and then the next field of the wafer 28 is brought into position relative to the optical assembly 16 and the reticle 26.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam illuminates selectively different portions of the reticle 26 and exposes the wafer 28. In FIG. 1, the illumination source 32 is illustrated as being supported above the reticle stage assembly 18. Typically, however, the illumination source 32 is secured to one of the sides of the apparatus frame 12 and the energy beam from the illumination source 32 is directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs EUV radiation (EUV) of wavelength 13.5 nm or lower, use of the catadioptric type optical system can be considered. For EUV the entire optical path should be in a vacuum. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Patent Application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 28. In FIG. 1, the reticle stage assembly 18 includes a reticle stage base 18A, a reticle stage 18B, and a reticle stage mover assembly 18C. The size, shape, and design of each these components can be varied to achieve the positioning requirements of the apparatus 10.

In FIG. 1, the reticle stage base 18A supports the reticle stage 18B and guides the movement of the reticle stage 18B along the X axis, along the Y axis and about the Z axis. In certain embodiments, the reticle stage base 18A is generally rectangular shaped and includes a generally planar guide surface that directly or indirectly supports and/or guides movement of the reticle stage 18B.

The reticle stage 18B retains the reticle 26. In one embodiment, the reticle stage 18B is generally rectangular shaped and includes a chuck (not shown) for holding the reticle 26.

The reticle stage mover assembly 18C moves and positions the reticle stage 18B. The design of the reticle stage mover assembly 18C can be varied to suit the movement requirements of the reticle stage 18B. In FIG. 1, the reticle stage mover assembly 18C includes a pair of spaced apart Y movers 18D that cooperate to move the reticle stage 18B along the Y axis and about the Z axis. Alternatively, the reticle stage mover assembly 18C can include one or more movers (not shown) that move the reticle stage 18B along the X axis, about the X axis and/or about the Y axis. Non-exclusive examples of the suitable movers 18D include linear actuators, voice coil actuators, planar motors, and other types of actuators.

Somewhat similarly, the wafer stage assembly 20 holds and positions the wafer 28 with respect to the projected image of the illuminated portions of the reticle 26. In FIG. 1, the wafer stage assembly 20 includes a wafer stage base 20A, a wafer stage 20B, and a wafer stage mover assembly 20C. The size, shape, and design of each these components can be varied to achieve the positioning requirements of the apparatus 10.

In FIG. 1, the wafer stage base 20A supports the wafer stage 20B and guides the movement of the wafer stage 20B along the X axis, along the Y axis and about the Z axis. In certain embodiments, the wafer stage base 20A is generally rectangular shaped and includes a generally planar guide surface that directly or indirectly supports and/or guides movement of the wafer stage 20B.

The wafer stage 20B retains the wafer 28. In one embodiment, the wafer stage 20B is generally rectangular shaped and includes a chuck (not shown) for holding the wafer 28.

The wafer stage mover assembly 20C moves and positions the wafer stage 20B. The design of the wafer stage mover assembly 20C can be varied to suit the movement requirements of the wafer stage 20B. In FIG. 1, the wafer stage mover assembly 20C includes a pair of spaced apart Y movers 20D that cooperate to move the wafer stage 20B along the Y axis and about the Z axis, and three spaced apart Z movers 20E that cooperate to move the wafer stage 20B along the Z axis, about the X axis, and about the Y axis. Alternatively, the wafer stage mover assembly 20C can include one or more movers (not shown) that move the wafer stage 20B along the X axis. Non-exclusive examples of the suitable movers 20D, 20E include linear actuators, voice coil actuators, planar motors, and other types of actuators.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528, 100 and 5,874,820 and Japanese Patent Application Disclosure No. 8-330224 are incorporated herein by reference.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, autofocus systems, and/or other measuring devices.

In FIG. 1, the measurement system 22 includes (i) a reticle measurement system 22A (only a portion is illustrated in FIG. 1) that monitors the position of the reticle stage 18B along the Y axis, and about the Z axis, and (ii) a wafer measurement system 22B (only a portion is illustrated in FIG. 1) that monitors the position of the wafer stage 20B along the Y axis, and about the Z axis, and that monitors the position of the wafer 28 relative to a reference structure along the Z axis, about the X axis, and about the Y axis. More specifically, in this embodiment, the wafer measurement system 22B includes the autofocus system 22C that monitors the position of the wafer 28 relative to the optical assembly 16 along the Z axis (the optical axis 29), about the X axis, and about the Y axis with improved accuracy. As a result thereof, the wafer stage assembly 20 can be controlled to position the wafer 28 with improved accuracy.

The control system 24 is connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
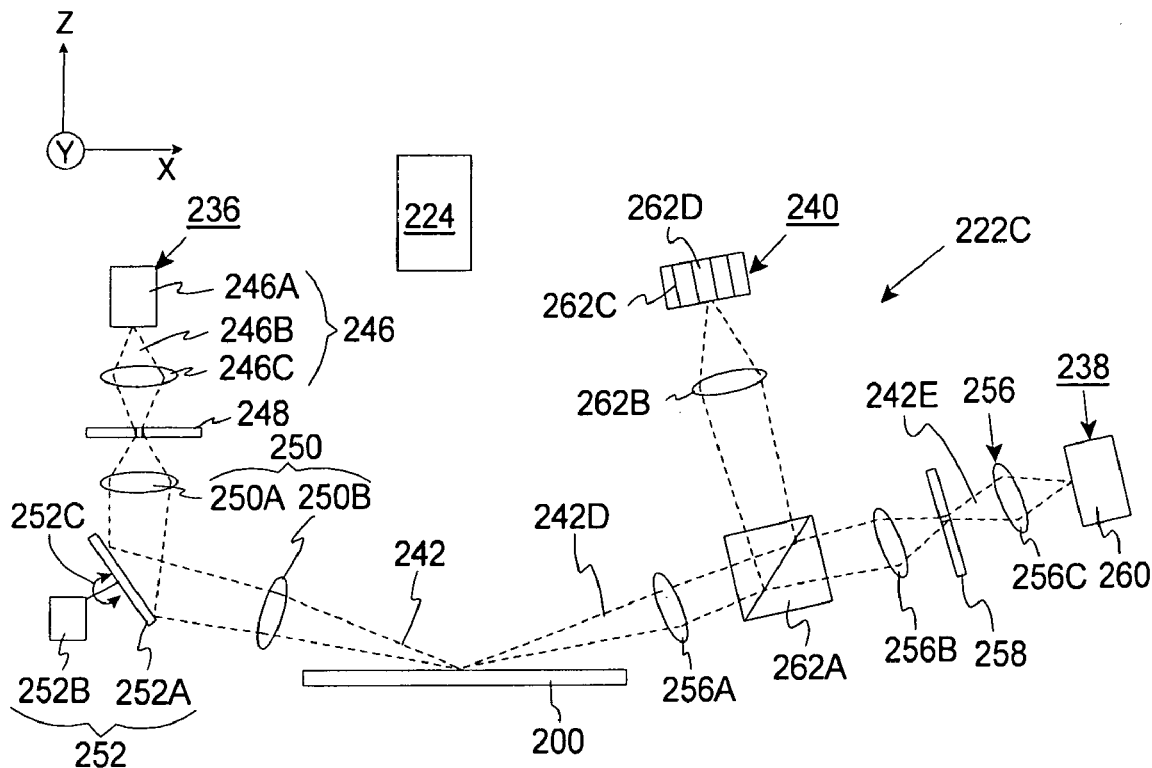
FIG. 2 is a simplified view of an autofocus system having features of the present invention and a work piece.

FIG. 2 is a simplified illustration of a work piece 200, a control system 224, and an autofocus system 222C that measures the position of the work piece 200 along the Z axis, about the X axis and about the Y axis. In this embodiment, for example, the work piece 200 can be the wafer 28 (illustrated in FIG. 1) that is being processed by the exposure apparatus 10 (illustrated in FIG. 1). Further, in this embodiment, the autofocus system 222C can be part of the measurement system 22 (illustrated in FIG. 1) that monitors the position of the wafer 28 along the Z axis. Alternatively, the work piece 200 can be another type of device positioned by a stage assembly. For example, the work piece 200 can be the reticle 26 (illustrated in FIG. 1) and the autofocus system 222C could be used to monitor the position of the reticle 26 along the Z axis. Still alternatively, the autofocus system 222C can be used to monitor the position of other types of work pieces 200 during manufacturing and/or inspection.

In certain embodiments, the autofocus system 222C is continuously measuring the position of the work piece 200 along the Z axis, even during exposure or other processing of the work piece 200. With this design, the stage mover assembly 20 (illustrated in FIG. 1) will constantly make real time adjustments to the Z position of the work piece 200 based on the measurements from the autofocus system 222C. Alternatively, for example, the position of the work piece 200 along the Z axis for each X, Y position can be premapped prior to exposing the work piece 200. With this design, for each X, Y position of the work piece 200, the stage control system 224 can make the appropriate adjustment to the Z position of the work piece 200 based on the premapped information.

In the embodiment illustrated in FIG. 2, the autofocus system 222C includes a slit light source assembly 236, a slit detector assembly 238, and a reflectance measuring system 240. Is should be noted that the reflectance measuring system 240 is sometimes referred to herein as a correction system. The design and positioning of each of these components can be varied to achieve the measurement requirements of the autofocus system 222C.

The slit light source assembly 236 generates an array of slits of light 242 and images the slits of light 242 onto the work piece 200. In non-exclusive examples, the slit light source assembly 236 can direct one, five, ten, fifteen, twenty, twenty-five, or thirty spaced apart slits of light 242 at the work piece 200. The size and shape of each slit of light 242 can be varied to achieve the desired performance requirements of the autofocus system 222C. For example, each slit of light 242 can be generally rectangular shaped.

Figure 3:
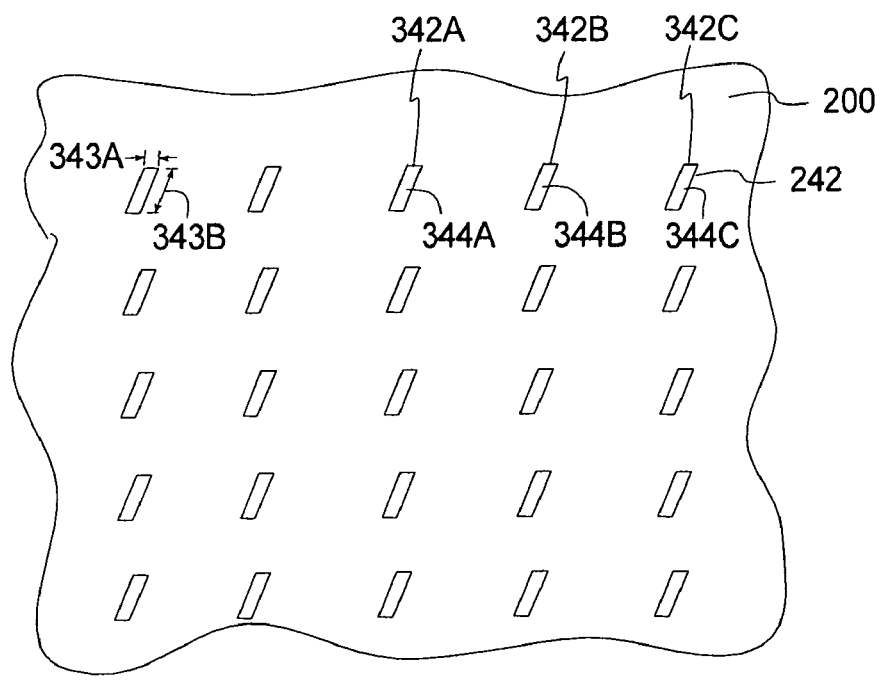
FIG. 3 is a simplified view of a plurality of spaced apart slit images projected onto the work piece.

FIG. 3 is a simplified view of a portion of the work piece 200, and a plurality of spaced apart slits of light 242 projected onto the work piece 200 by the slit light source assembly 236 (illustrated in FIG. 2). In this embodiment, there are twenty-five slits of light 242 that are projected onto the work piece 200. Moreover, in FIG. 3, three of the slits of light 242 have been labeled a first slit of light 342A, a second slit of light 342B, and a third slit of light 342C. However, it should be noted that any of the slits of light 242 in FIG. 3 can be referred to as the first, second, and/or third slit of light.

Further, in FIG. 3, each of the slits of light 342 is generally rectangular shaped and has a slit width 343A and a slit length 343B. In one non-exclusive embodiment, the slit width 343A is approximately 0.3 mm and the slit length 343B is approximately 2 mm.

For convenience, (i) the area of the work piece 200 at which the first slit of light 342A is projected is called the first slit area 344A, (ii) the area of the work piece 200 at which the second slit of light 342B is projected is called the second slit area 344B, and (iii) the area of the work piece 200 at which the third slit of light 342C is projected is called the third slit area 344C. It should be noted that area of the work piece 200 at which each silt of light 342A, 342B, 342C is projected will change as the work piece 200 is moved along the X axis and/or along the Y axis.

Referring back to FIG. 2, the slit light source assembly 236 includes a slit light source 246, a source set of slits 248 (e.g. a slit mask), a source imaging system 250, and a vibrating element assembly 252. The design and location of each of these components can be varied to achieve the desired design of the slit light source assembly 236. For example, as described below, the vibrating element assembly 252 can be located on the slit detector assembly 238 side of the autofocus system 222C instead. Further, it should be noted that the slit light source assembly 236 can include more or fewer components than described herein.

In one embodiment, the slit light source 246 can include an unpolarized source 246A of light 246B and a source lens 246C. For example, the source 246A can generate visible light 246B in the wavelengths of between approximately 600-900 nanometers. The source lens 246C focuses the light 246B from the source 246A onto the source set of slits 248.

The source set of slits 248 shapes the light 246B from the slit light source 246 into the plurality of slits of light 242. In one embodiment, the source set of slits 248 is a plate that includes a plurality of spaced apart, slit shaped openings. In this embodiment, to generate generally rectangular shaped slits of light 242, the slit shaped openings are generally rectangular shaped.

In FIG. 2, the source imaging system 250 focuses the slits of light 242 onto the wafer 200. In this embodiment, the source imaging system 250 includes a first imaging lens 250A that collimates the image of the slits, and a second imaging lens 250B that focuses the slits of light 242 onto the work piece 200, so that placing the vibrating element assembly 252 between the imaging lenses 250A, 250B causes the slit images 242 to vibrate on the work piece 200.

In FIG. 2, the vibrating element assembly 252 causes the position of the slits of light 242 to move back and forth on the work piece 200 (e.g. substantially perpendicular to the length of the slits of light 242). In one embodiment, the vibrating element assembly 252 includes a mirror 252A that redirects the slits of light 242, and a mirror mover 252B that moves the mirror 252A as illustrated by arrow 252C. Alternatively, a phase element like an LCD or a vibrating lens can be used instead of the mirror 252A The vibrating element assembly 252 acts to vibrate the images of the slits 242 on the slit detector assembly 238 and thus produce information about the direction and magnitude of the work piece 200 position along the optical axis, as described in more detail below.

It should be noted that the slits of light 242 are projected onto the work piece 200 at a glancing angle. Stated in another fashion, each slit of light 242 has an angle of incidence relative to normal of the work piece 200. As non-exclusive examples, the angle of incidence can be between approximately sixty-two (62) and eighty-five (85) degrees.

The slits of light 242 are subsequently reflected off of the work piece 200 and are re-imaged onto the slit detector assembly 238.

The slit detector assembly 238 detects light 242D that is reflected off of the work piece 200. For example, the slit detector assembly 238 can detect one, five, ten, fifteen, twenty, twenty-five, or thirty spaced apart slits of reflected light 242D that are reflected off of the work piece 200.

In one embodiment, the slit detector assembly 238 includes a detector imaging system 256, a detector set of slits 258 (e.g. "a slit mask"), and a detector 260. The detector imaging system 256 focuses the light reflected off of the work piece 200 onto the detector set of slits 258, and subsequently onto the detector 260. In the embodiment illustrated in FIG. 2, the detector imaging system 256 includes (i) a first detector lens 256A that collimates the light 242D reflected off of the work piece 200 through a beam splitter 262A of the reflectance measuring system 240, (i) a second detector lens 256B that focuses the light from the beam splitter 262A onto the detector set of slits 258, and (iii) a third detector lens 256C that focuses light 242E that passes through the detector set of slits 258 onto the detector 260.

The detector set of slits 258 is a plate that includes a plurality of spaced apart, slit shaped openings. In one embodiment, the slit shaped opening of the detector set of slits 258 matches the ideal image of slits 248. The light 242E that passes through the detector set of slits 258 is subsequently measured by the detector 260.

Figure 4A:
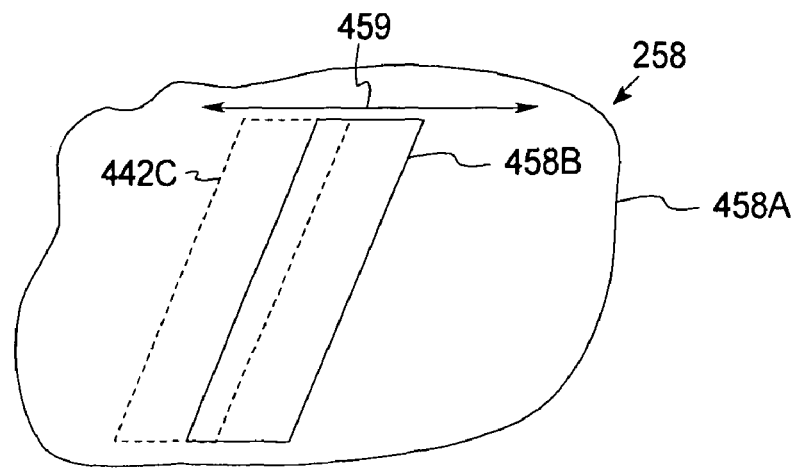
FIG. 4A illustrates a portion of the detector set of slits.

FIG. 4A illustrates a portion of the detector set of slits 258 in more detail. More specifically, FIG. 4A illustrates a portion of a plate 458A and one of the plurality of slit shaped openings 458B for the detector set of slits 258. Further, FIG. 4A illustrates one of the reflected slits of light 442C (illustrated in phantom) that was reflected off of the work piece 200 and reimaged onto the detector set of slits 258. It should be noted that movement of the mirror 252A (illustrated in FIG. 2) causes the slits of light 242 to move back and forth (as illustrated by arrow 459) relative to the slit shaped openings 458B.

When the image of the slits 242D is aligned with the detector set of slits 258, light is maximally transmitted through each slit 458B to a set of detectors 260 (one for each slit). This can be referred to as the perfectly aligned state of the work piece. As the position of the work piece 200 along the optical axis varies from the perfectly aligned state, the image of the slits 242D shifts on the detector set of slits 258 and the amount of light reaching each of the detectors 260 decreases. This reduction in the amount of light reaching the detectors 260 can be used to determine the magnitude of the shift of the work piece 200, but it is not enough information to determine the direction of the shift.

Referring back to FIG. 2, the detector 260 measures the amount of light 242D that passes through each of the slits of the detector set of slits 258. In one embodiment, the detector 256 includes a separate sensor for each of the slits of light 242E that passes through the detector set of slits 258 to measure the amount of light 242E that passes through each of the slits 258. In this embodiment, each light sensor can, for example, include a photo detector or another type of light detector.

Further, the detector 260 provides a separate slit signal that corresponds to the light detected by each light sensor to the control system 224. For example, the detector 256 can provide a separate slit signal for each slit of light 242D that passes through the detector set of slits 258. Each of the slits 242D in the array of slits provides information about a small region on the work piece 200. Also, as the work piece 200 moves under the images of the slits the topography of the work piece 200 is mapped out.

Figure 4B:
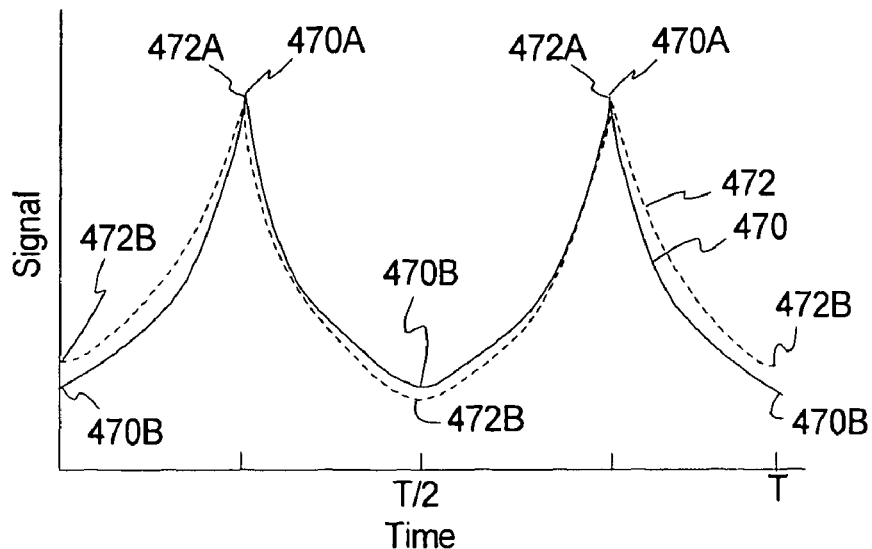
FIG. 4B illustrates a raw detector signal from a detector versus time for one period of oscillation of a mirror.

FIG. 4B illustrates a raw slit detector signal from one of the detectors 260 versus time for one period of oscillation of the mirror 252A (illustrated in FIG. 2). In this example, solid line represents the slit detector signal 470 when the work piece 200 (illustrated in FIG. 2) is at the proper Z position, while dashed line represents the slit detector signal 472 when the work piece 200 is not at the proper Z position. In FIG. 4B, one period of oscillation of the mirror 252A is equal to T.

When the work piece 200 is at the proper position along the Z axis, the slit images 242 (illustrated in FIG. 4A) are centered on the slit openings 458B (illustrated in FIG. 4B) and the detectors 260 (illustrated in FIG. 2). At this position, the slit detector signal 470 from the detectors 260 has a maximum value 470A and a minimum value 470B.

Alternatively, if the work piece 200 is not at the proper position along the Z axis, the slit images 242 are not centered on the slit openings 458B and the detectors 260. At this position, the slit detector signal 472 from the detectors 260 also has a maximum value 472A and a minimum value 472B. However, when the work piece 200 is not at the proper position, every other minimum value 472B is deeper.

Referring back to FIG. 2, the control system 224 receives the detector signals from the detectors 260, processes the signals to determine the position of the work piece 200 along the Z axis. In order to determine the direction of the shift, up or down, the vibrating mirror 252A causes the position of the reflected image of the light 242D on the detector set of slits 258 to oscillate in time, and as a result so does the signal on each of the detectors 260.

Figure 4C:
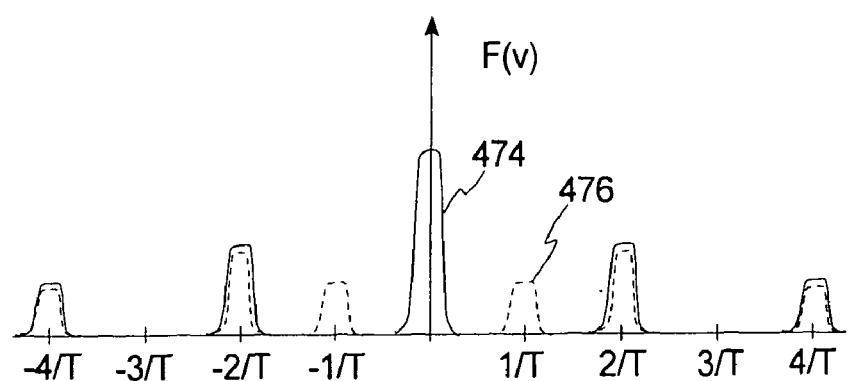
FIG. 4C is a simplified graph that illustrates the slit detector spectrum.

FIG. 4C is a simplified illustration of the slit detector spectrum. In FIG. 4C, the solid line 474 represents the perfectly aligned state, while the dashed line 476 represents the shifted state. When the work piece 200 is in the perfectly aligned state, (i) the detected signal 474 is periodic with a period equal to half that of the vibrating mirror; and (ii) the detected signal 474 reaches the same maximum and the same minimum twice for each oscillation of the vibrating mirror. Alternatively, when the work piece 200 is shifted along the optical axis, the detected signal 476 will contain a frequency component that matches the fundamental frequency of the vibrating mirror.

The control system 224 can be configured to perform a Fourier transform on the detected signals 474, 476 to produce the amplitudes of these first two harmonics of the detected signals 474, 476. For small shifts of the work piece 200 from the perfectly aligned state, the ratio of the fundamental frequency to the second harmonic is proportional to the amount of shift of the work piece. Calibration of the system will produce the constant of proportionality needed to calculate the position of the work piece 200 given a measurement of the ratio of the magnitude of the fundamental frequency to the magnitude the second harmonic.

When the reflectivity changes uniformly across the work piece 200, the ratio of the magnitudes of fundamental frequency to the second harmonic is unchanged. However, when the reflectivity varies over the work piece 200, on a scale comparable to the size of the image of the slit on the work piece 200, the ratio of the magnitudes of fundamental frequency to the second harmonic will depend on the position of the slit images on the work piece 200. This is because the reflectance pattern of the work piece 200 will influence the uniformity of the slit images on the detector set of slits 258 and subsequently the shape of the detector signal and its Fourier transform, sometimes producing an erroneous first harmonic.

Stated in another fashion, variations of reflectance of the work piece 200 will influence the light 242D reflected off of the work piece 200. The present invention provides a means of correcting for the reflectance variations of the work piece 200. The basic principle is that a duplicate image of the reflected slits of light 242D is directed to the reflectance measuring system 240. With the reflected slits of light, the reflectance measuring system 240 measures the reflectance of the work piece 200 at least a portion of one or more of the slit areas 344A, 344B, 344C (illustrated in FIG. 3) on the work piece 200. For example, the reflectance measuring system 240 can independently measure the reflectance of the work piece 200 at one, five, ten, fifteen, twenty, twenty-five, or thirty spaced apart slit areas 344A, 344B, 344C. In FIG. 2, the reflectance measuring system 240 includes a beam splitter 262A, a lens 262B, and a reflectance sensor 262C.

The beam splitter 262A splits a portion of the slits of lights 242D that are reflected from the work piece 200. The lens 262B focuses the light from the beam splitter 262A onto the reflectance sensor 262C. The reflectance sensor 262C measures some feature or characteristic that relates to the reflectance of at least a portion of the work piece 200.

In one embodiment, the reflectance sensor 262C includes a separate reflectance measurer 262D (only five are illustrated in FIG. 2) for each of the plurality of slit areas 344A, 344B, 344C. For example, each of the reflectance measurer 262D can be an area type detector such as a charge coupled device. Alternatively, for example, each of the reflectance measurers 260 can be a split slit detector, where each slit of light (or a subset of the slits of light) is divided into several sub-slits and each sub slit is directed to a separate detector element.

Figure 5A:
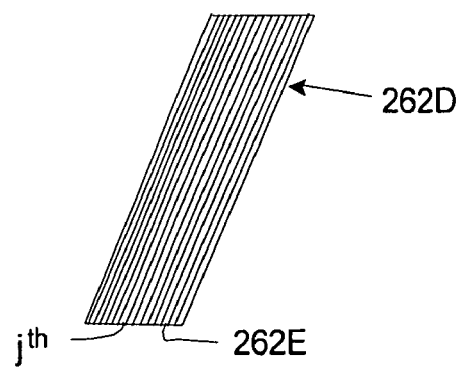
FIG. 5A is a simplified view of one embodiment of a reflectance sensor having features of the present invention.

Referring to FIG. 5A, in one embodiment, each reflectance measurer 262D (only one is illustrated in FIG. 5A) includes a plurality of sub-area detectors 262E that cooperate to measure the reflectance of the work piece 200 at one of the slit areas. Stated in another fashion, each sub-area detector 262E is capable of measuring the relative reflectance in sub-regions of the slit image. In FIG. 5A, one of the sub-area detectors 262E is labeled the jth sub-area detector 262E.

The number, shape and design of each sub-area detector 262E can be varied pursuant to the teaching provided herein. For example, in one embodiment, each sub-area detector 262E is a pixilated detector such as a CCD. Further, each sub-area detector 262E be a rectangular shaped (slit shaped) detector having a length that is similar to that of the reflected slit of light and a width that is less than the reflected slit of light. Thus, each sub-area detector 262E is aligned with, and spans the length of the slit image. With this design, each reflectance measurer 262D can include a plurality (e.g. 2, 5, 10, 15, or 20) sub-area detectors 262E. Alternatively, for example, one or more of the sub-area detector 262E can be generally square pixel shaped.

With this design, when the vibrating mirror 252A is located in the sending side imaging system, the image of the slit on the sub-area detectors 262E will vibrate, but the image of the work piece is actually fixed. Therefore, if the sub-area detector 262E image is averaged over one or more cycles of vibration, assuming the illumination power of the slit light source assembly is fixed during that time, the relative reflectance between positions on the work piece may be determined. Once the relative reflectance is calculated by the control system 224, it can be used to reconstruct a detector signal that is relatively insensitive to patterns on the work piece 200.

Thus, the reflectance measuring system 240 provides separate reflectance information regarding the reflectance measured by each reflectance measurer 262D to the control system 224. For example, reflectance measuring system 240 will provide first reflectance information for the reflectance of the first slit area 344A, second reflectance information for the reflectance of the second slit area 344B, and third reflectance information for the reflectance of the third slit area 344C.

With this design, the control system 224 can use a Fourier transform of the reconstructed signal to determine the fundamental and second harmonics. The ratio is taken, and this is used to determine the position of the work piece along the optical axis. For example, the first harmonic of each reconstructed slit signal is proportional to the position of the work piece 200 at that particular slit area along the Z axis.

In one embodiment, the control system 224 uses the reflectance information as an error compensation factor for the slit signal from the slit detector assembly 238. As a result thereof, the compensation factor will compensate for the patterns or other features on the work piece 200 that alter the reflectance of the work piece 200. Further, the Z axis measurement generated by the control system 224 will be more accurate.

Thus, the control system 224 uses the slit signals from slit detector assembly 238 and the reflectance information from the reflectance measuring system 240 to determine the position of the work piece 200 along the Z axis, about the X axis, and about the Y axis.

Figure 5B:
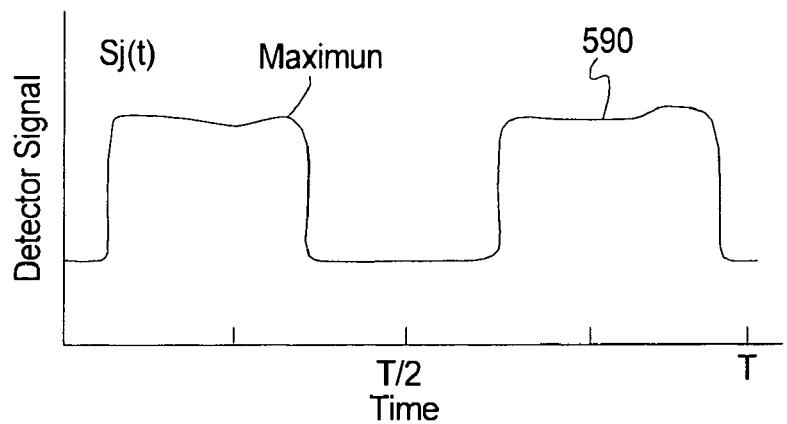
FIG. 5B is a graph that illustrates a detector signal from a reflectance measuring system.

FIG. 5B is a graph that illustrates a detector signal 590 from the sub-area detector 262E labeled j relative to time. The maximum value is also labeled in FIG. 5B. As illustrated in FIG. 5B, the detector signal 590 varies over time because the vibrating mirror 252A is moving the reflected slit relative to the sub-area detector 262E labeled j.

As provided herein, the original slit signal f(t) at detector element j can be calculated as follows:

$$f(t) = A \sum_j S_j(t)$$

where A is a constant, $S_j$ is the detector signal from detector element j, and t is time.

Further, the corrected detector signal $\hat{f}(t)$ at detector element j can be calculated as follows:

$$\hat{f}(t) = A \sum_j a_j S_j(t)$$

where A is a constant, $a_j$ is a correction factor based on the detector signal, $S_j$ is the detector signal from detector element j, and t is time.

Further, in one embodiment, the correction factor aj can be calculated as follows:

$$aj = (Max[s_j(t)]/t)^{-1}$$

where Max is the maximum value of the detector signal $S_j$, $S_j$ is the detector signal from detector element j, and t is time. Thus the value is divided by the maximum value to normalize the value of the detector signal.

It should be noted that the correction system 240 could be designed to expand the reflected slit image perpendicular to its long dimension (along its length) to allow the array of slit regions to have larger slits with larger separations. This design has the advantage that multiple slit detectors of the correction system 240 can be fabricated and positioned much easier.

In another embodiment, the reflected slit image could be imaged onto a facetted mirror, so the reflected slit image is divided in angle and then directed to widely spaced apart slit detector elements.

As described above, the autofocus system 222C can include the vibrating mirror 252A that is used to make the slits of light 242 on the work piece 200 oscillate substantially perpendicular to the length of the slits of light 242. This introduces a possible complication to this compensation scheme. To achieve stationary slits of reflected light on the reflectance measuring system 240, the slit light source assembly 236 could be strobed or chopped. The strobing/chopping would occur at stationary points in the motion of the slit image so the motion on the correction system 240 could be minimized.

Another method could employ a second vibrating mirror, or equivalent, to "unvibrate" the slit image so that it is always stationary (or nearly so) on the correction system 240.

Yet another embodiment could utilize multiple beam splitters so that the multiple detectors 260 can be spaced apart.

Alternatively, motion of the slit could be used in implementing the slicing of the slit image. For example, if the beam received by the correction system 240 is directed to a single slit detector (smaller than the slit image), the slit image could be chopped/strobed once per vibrating mirror cycle so that the slit image is displaced a small amount between vibrating mirror cycles. In this way, the slit regions could be built up over several cycles of vibration.

Figure 6:
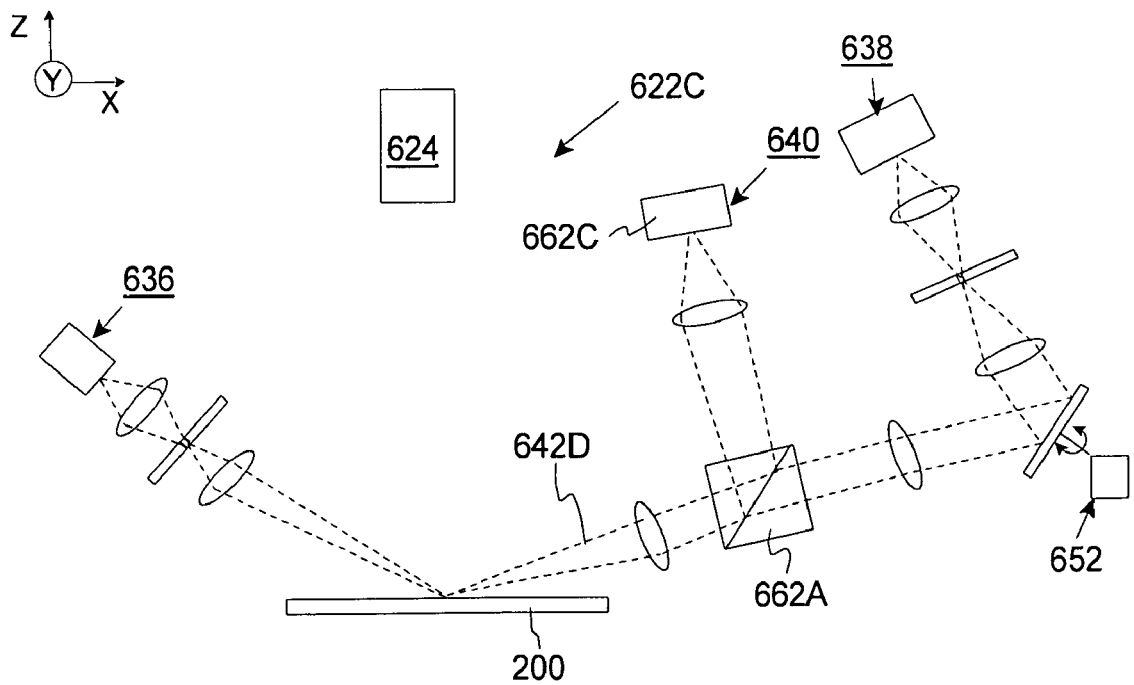
FIG. 6 is a simplified view of another embodiment of the autofocus system.

FIG. 6 is a simplified illustration of a work piece 200, a control system 624, and another embodiment of an autofocus system 622C that measures the position of the work piece 200 along the Z axis, about the X axis and about the Y axis. In this embodiment, the autofocus system 622C includes a slit light source assembly 636, a slit detector assembly 638, and a reflectance measuring system 640 that are similar to the corresponding components described above. However, in this embodiment, the vibrating element assembly 652 is part of the slit detector assembly 638. Further, the vibrating element assembly 652 is located after a beam splitter 662A that directs a portion of the reflected beam 642D to a reflectance sensor 662C. As a result thereof, the reflected beam 624D is stationary on the reflectance sensor 662C.

It should be noted that the present invention can be applied to a so-called liquid immersion exposure apparatus that locally fills liquid between the projection optical system and the substrate and exposes the substrate via the liquid, but there are also disclosures with respect to liquid immersion exposure apparatuses in the International Patent Publication No. 99/49504 pamphlet. In addition, the present invention may also be applied to a liquid immersion exposure apparatus that performs exposure in a status in which the entire surface of the substrate to be exposed is immersed in the liquid, such as those disclosed in Japanese Unexamined Patent Application Publication No. H6-124873, Japanese Unexamined Patent Application Publication No. H10-303114, and U.S. Pat. No. 5,825,043.

In addition, the present invention can also be applied to twin-stage type exposure apparatuses in which a plurality of substrate stages (wafer stages) are provided. The structure and the exposure operations of twin-stage type exposure apparatuses are disclosed in, for example, Japanese Unexamined Patent Application Publication No. 10-163099, Japanese Unexamined Patent Application Publication No. 10-214783 (corresponds to U.S. Pat. Nos. 6,341,007, 6,400,441, 6,549,269 and 6,590,634), Tokuhyo No. 2000-505958 (corresponds to U.S. Pat. No. 5,969,441) and U.S. Pat. No. 6,208,407. In addition, the present invention may also be applied to the wafer stage of Patent Application No. 2004-168481 previously applied for by the applicants of the present application.

Figure 7A:
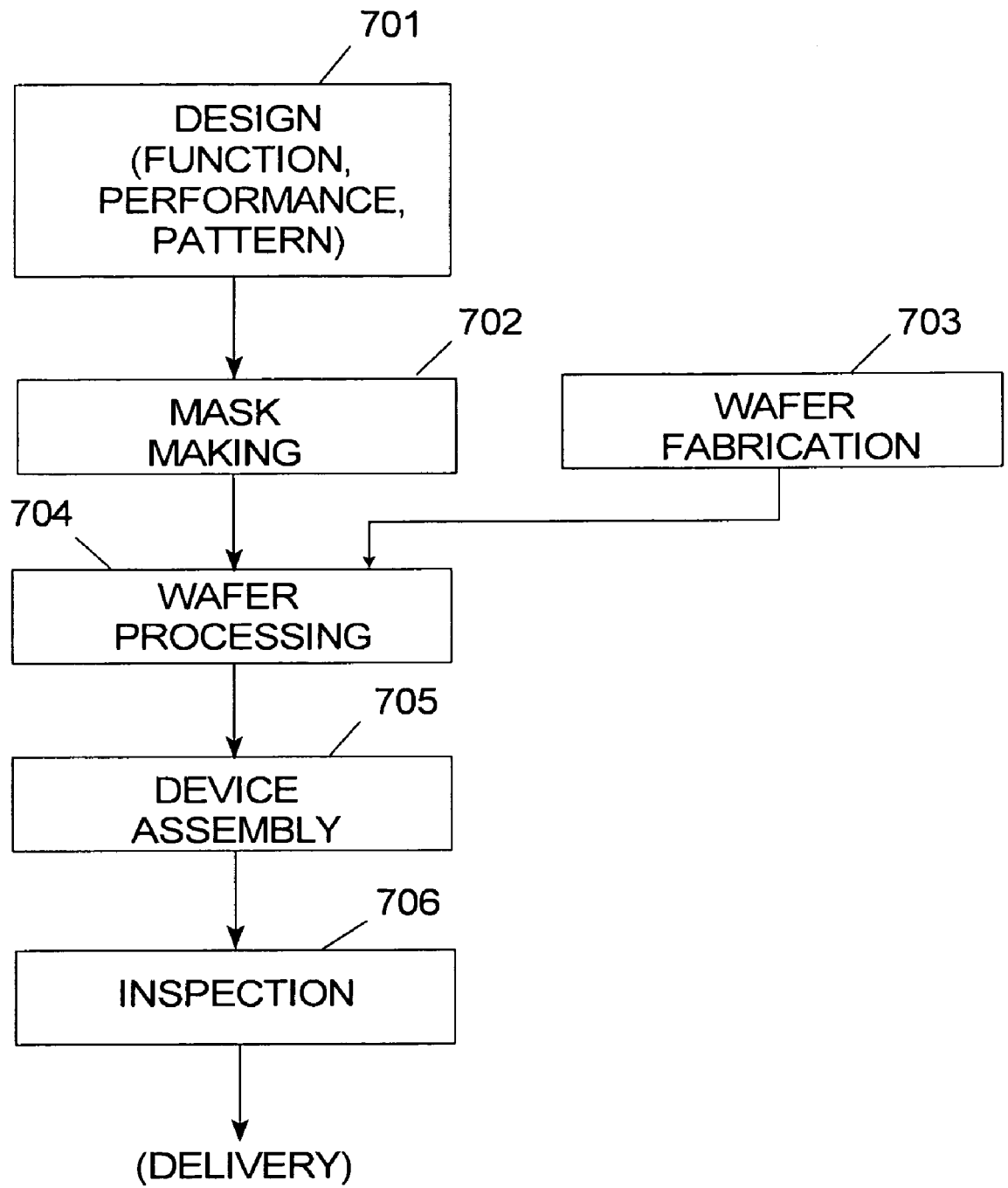
FIG. 7A is a flow chart that outlines a process for manufacturing a device in accordance with the present invention.

Semiconductor devices can be fabricated using the above described systems, by the process shown generally in FIG. 7. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705, the semiconductor device is assembled (including the dicing process, bonding process and packaging process), finally, the device is then inspected in step 706.

Figure 7B:
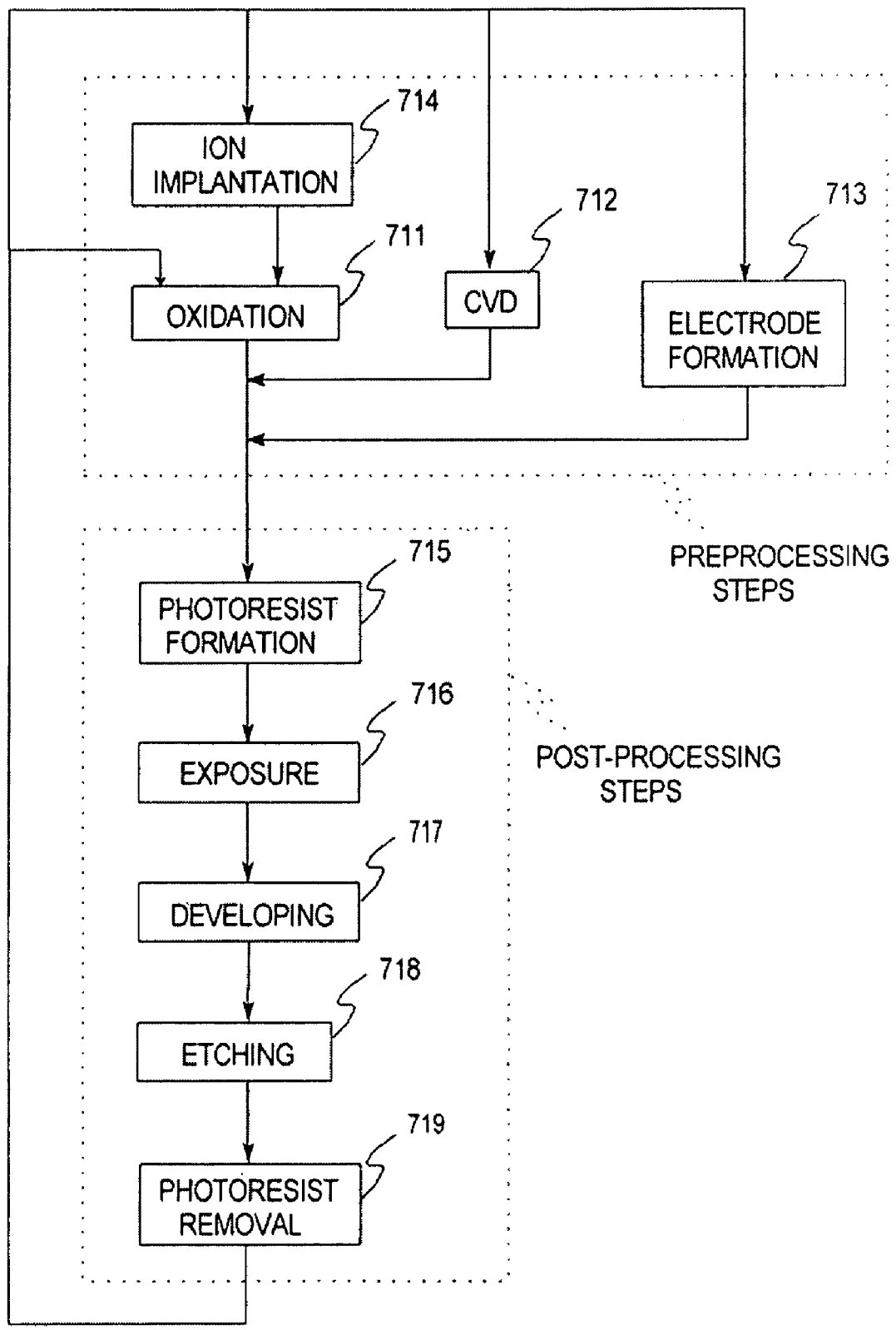
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed. Multiple circuit patterns are formed by repetition of these preprocessing and post-processing steps.

It is to be understood that movers disclosed herein are merely illustrative of the presently preferred embodiments of the invention and that no limitations are intended to the details of construction or design herein shown other than as described in the appended claims.

What is claimed is:

1. An autofocus system for measuring the position of a work piece along an axis, the work piece including a first slit area, the autofocus system comprising:
    a slit light source assembly that directs a first slit of light at the first slit area of the work piece;
    a slit detector assembly that detects light reflected off of the first slit area and generates a first slit signal relating to the amount of light reflected off of the first slit area; and
    a control system that uses the first slit signal from the slit detector assembly, and first reflectance information of the first slit area to determine the position of the work piece along the axis.

2. The autofocus system of claim 1 further comprising a reflectance measuring system that generates the first reflectance information relating to the reflectance at the first slit area.

3. The autofocus system of claim 2 wherein the reflectance measuring system includes an area type detector.

4. The autofocus system of claim 3 wherein the area type detector is a charge coupled device.

5. The autofocus system of claim 1 wherein the control system uses the first reflectance information as a compensation factor for the first slit signal from the slit detector assembly.

6. The autofocus system of claim 1 wherein (i) the slit light source assembly directs a second slit of light at a second slit area of the work piece, (ii) the slit detector assembly detects light reflected off the second slit area and generates a second slit signal relating to the amount of light reflected off of the second slit area at the slit detector assembly, and (iii) the control system uses the slit signals from the slit detector assembly, first reflectance information from the first slit area, and second reflectance information from the second slit area to determine the position of the work piece along the axis.

7. A stage assembly that moves a work piece, the stage assembly including a stage that retains the work piece and the autofocus system of claim 1 that measures the position of the work piece along an axis.

8. An exposure apparatus including an illumination system and the stage assembly of claim 7 that moves the stage relative to the illumination system.

9. A process for manufacturing a device that includes the steps of providing a substrate and forming an image to the substrate with the exposure apparatus of claim 8.

10. A method for measuring the position of a work piece along an axis, the work piece including a first slit area, the method comprising the steps of:
    directing a first slit of light at the first slit area of the work piece with a slit light source assembly;
    detecting light reflected off of the first slit area with a slit detector assembly that generates a first slit signal relating to the amount of light reflected off of the first slit area at the slit detector assembly; and
    determining the position of the work piece along the axis with a control system that uses the first slit signal from the slit detector assembly and first reflectance information of the first slit area.

11. The method of claim 10 further comprising the step of generating the first reflectance information with a reflectance measuring system that measures the reflectance at the first slit area.

12. The method of claim 10 wherein the step of determining includes the control system using the first reflectance information as a compensation factor for the first slit signal from the slit detector assembly.

13. The method of claim 10 further comprising the steps of (i) directing a second slit of light at a second slit area of the work piece with the slit light source assembly, and (ii) detecting the light reflected off the second slit area with the slit detector assembly and generating a second slit signal relating to the amount of light reflected off of the second slit area at the slit detector assembly; and wherein the control system uses slit data from the slit detector assembly, first reflectance information from the first slit area, and second reflectance information from the second slit area to determine the position of the work piece along the axis.

14. A method for moving a work piece comprising the steps of retaining the work piece with a stage, moving the stage with a stage mover assembly, and measuring the position of the work piece with the method of claim 10.

15. A process for manufacturing a device that includes the steps of providing a work piece, moving the work piece by the method of claim 14, and transferring an image on the work piece.

* * * * *